(12) United States Patent
Sunaga et al.

(10) Patent No.: US 9,104,000 B2
(45) Date of Patent: Aug. 11, 2015

(54) OPTICAL MODULE

(71) Applicant: Hitachi Metals, Ltd., Tokyo (JP)

(72) Inventors: Yoshinori Sunaga, Hitachinaka (JP); Kouki Hirano, Hitachinaka (JP); Hiroki Yasuda, Mito (JP); Hiroshi Ishikawa, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 14/099,778

(22) Filed: Dec. 6, 2013

(65) Prior Publication Data

US 2014/0212086 A1   Jul. 31, 2014

(30) Foreign Application Priority Data

Jan. 28, 2013   (JP) ................................. 2013-012900

(51) Int. Cl.
| | |
|---|---|
| *G02B 6/36* | (2006.01) |
| *G02B 6/42* | (2006.01) |
| *H05K 3/00* | (2006.01) |
| *G02B 6/38* | (2006.01) |

(52) U.S. Cl.
CPC .............. *G02B 6/428* (2013.01); *G02B 6/3897* (2013.01); *G02B 6/4278* (2013.01); *G02B 6/4281* (2013.01); *G02B 6/4292* (2013.01); *H05K 3/0058* (2013.01); *H05K 2201/056* (2013.01)

(58) Field of Classification Search
CPC .. G02B 6/4201; G02B 6/4214; G02B 6/4246; G02B 6/29361; G02B 6/4249; H05K 1/189; H05K 2201/056; H05K 2201/10121; H05K 2201/10189; H05K 3/0058

USPC ................... 385/14, 39, 88; 398/139, 141
See application file for complete search history.

(56) References Cited

U.S. PATENT DOCUMENTS

| | | | | |
|---|---|---|---|---|
| 4,750,836 | A | * | 6/1988 | Stein ............................. 356/399 |
| 4,822,129 | A | * | 4/1989 | Webb .............................. 385/79 |
| 5,184,963 | A | * | 2/1993 | Ishikawa ......................... 439/79 |
| 5,611,013 | A | * | 3/1997 | Curzio ............................ 385/89 |
| 5,768,456 | A | * | 6/1998 | Knapp et al. .................... 385/49 |
| 6,095,697 | A | * | 8/2000 | Lehman et al. ................ 385/88 |
| 6,114,757 | A | * | 9/2000 | DelPrete ....................... 257/678 |
| 6,942,398 | B2 | * | 9/2005 | Morioka ......................... 385/93 |

(Continued)

FOREIGN PATENT DOCUMENTS

| | | | | |
|---|---|---|---|---|
| JP | | 10322853 | A * | 12/1998 |
| JP | 2007304266 | A * | 11/2007 | |

(Continued)

OTHER PUBLICATIONS

Lamprecht et al. Passive alignment of optical elements in a printed circuit board, Electronic Components and Technology Conference, 2006. Proceedings. 56th p. 761.*

*Primary Examiner* — Peter Radkowski
(74) *Attorney, Agent, or Firm* — McGinn IP Law Group, PLLC

(57) ABSTRACT

An optical module includes a substrate including a conductor pattern formed thereon, a photoelectric conversion element mounted on the substrate, and an optical coupling member for optically coupling the photoelectric conversion element to an optical fiber. A part of the conductor pattern on the substrate defines an engagement portion that engages with the optical coupling member so as to position the optical coupling member relative to the substrate.

20 Claims, 5 Drawing Sheets

(56) References Cited

U.S. PATENT DOCUMENTS

| | | |
|---|---|---|
| 7,004,644 B1* | 2/2006 | Johnson .................. 385/89 |
| 7,103,249 B2* | 9/2006 | Miyamae ................. 385/49 |
| 7,226,221 B2* | 6/2007 | Morioka .................. 385/93 |
| 7,508,606 B2* | 3/2009 | Neely ..................... 359/821 |
| 7,604,419 B2* | 10/2009 | Morioka ................. 385/93 |
| 7,720,337 B2* | 5/2010 | Lu et al. ................. 385/52 |
| 7,872,686 B2* | 1/2011 | Kale et al. .............. 348/374 |
| 2004/0184743 A1* | 9/2004 | Morioka ................. 385/93 |
| 2004/0190837 A1* | 9/2004 | Morioka ................. 385/93 |
| 2004/0264883 A1* | 12/2004 | Althaus et al. .......... 385/88 |
| 2005/0025435 A1* | 2/2005 | Miyamae ............... 385/88 |
| 2006/0104577 A1* | 5/2006 | Morioka ................. 385/93 |
| 2009/0162005 A1* | 6/2009 | Lu et al. ................. 385/14 |
| 2009/0202252 A1* | 8/2009 | Sunaga et al. .......... 398/139 |
| 2009/0285580 A1* | 11/2009 | Yasuda et al. .......... 398/139 |
| 2010/0215312 A1* | 8/2010 | Daikuhara et al. ..... 385/14 |
| 2010/0266245 A1* | 10/2010 | Sabo ...................... 385/79 |

FOREIGN PATENT DOCUMENTS

| | | |
|---|---|---|
| JP | 2010-122311 A | 6/2010 |
| WO | WO 0045467 A1 * | 8/2000 |

* cited by examiner

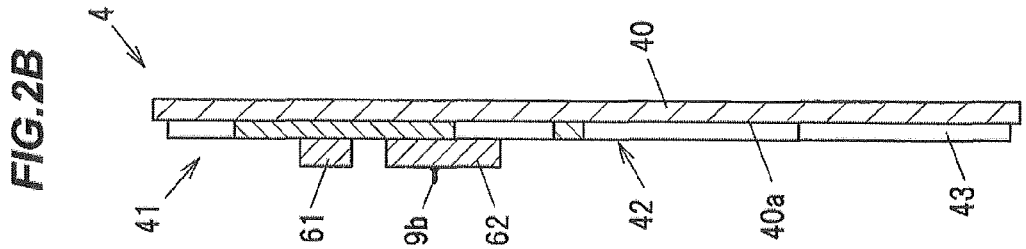
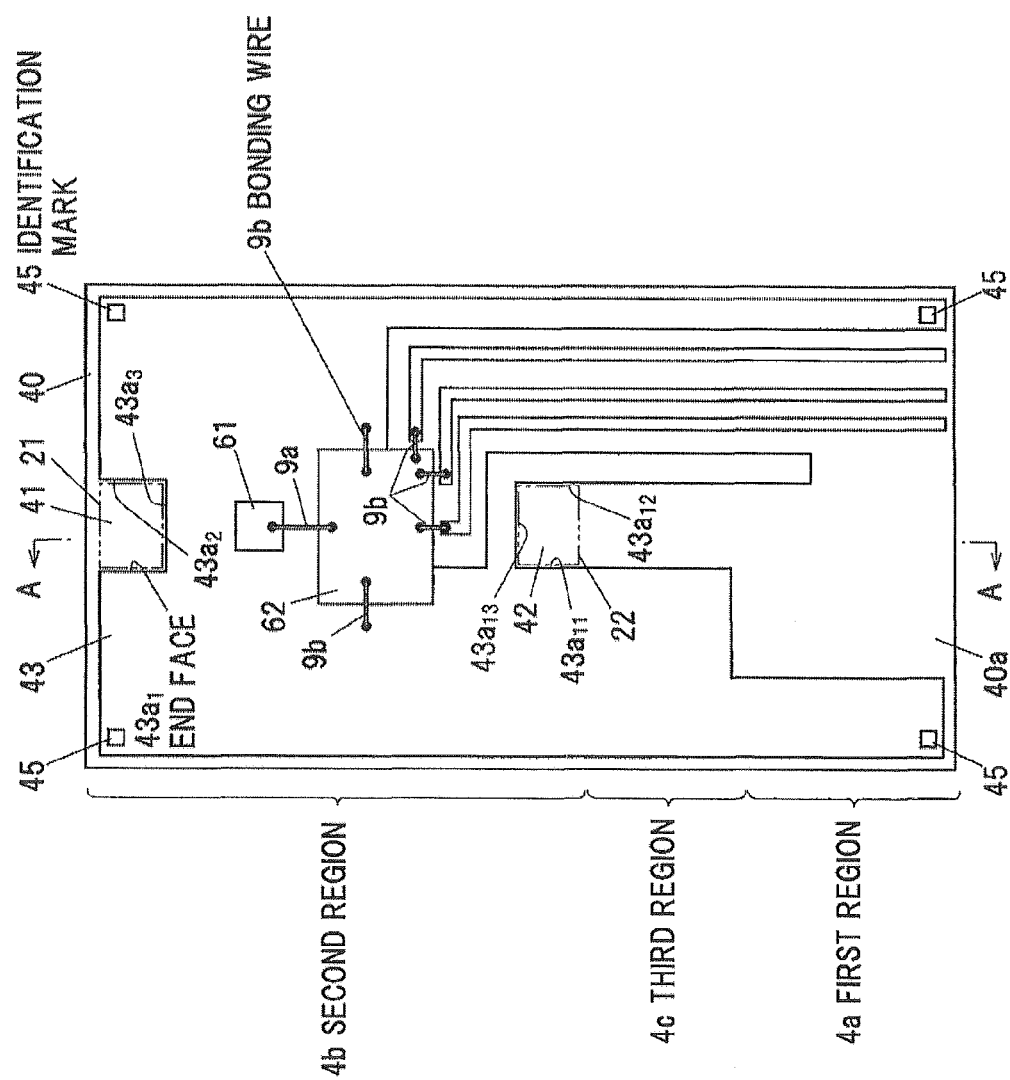

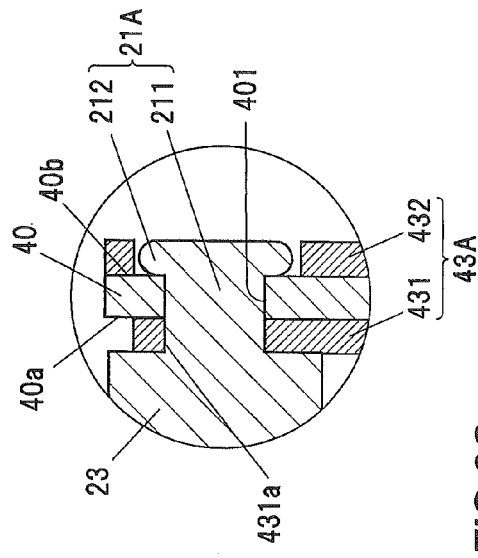
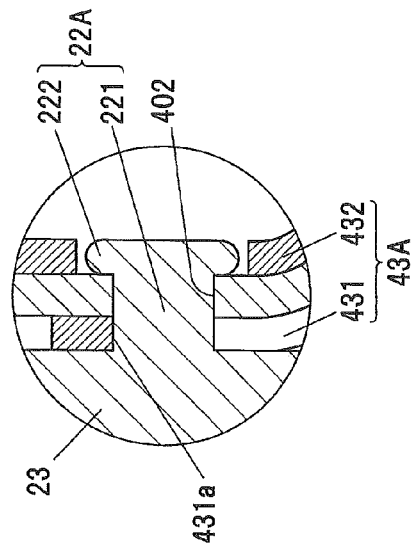
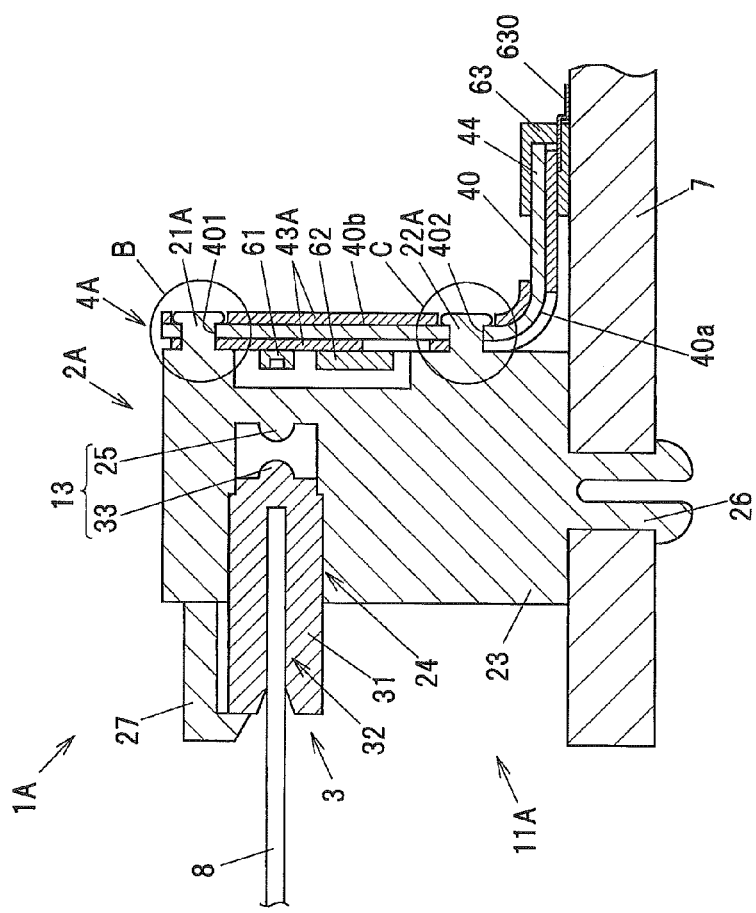
FIG.3A
FIG.3B
FIG.3C
211 BASE PORTION  212 FLANGE PORTION
221 BASE PORTION  222 FLANGE PORTION
401 FIRST THROUGH-HOLE  402 SECOND THROUGH-HOLE

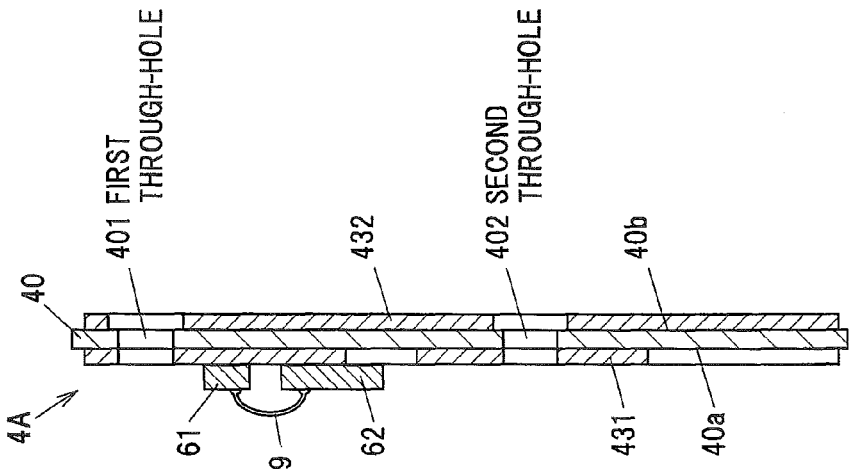
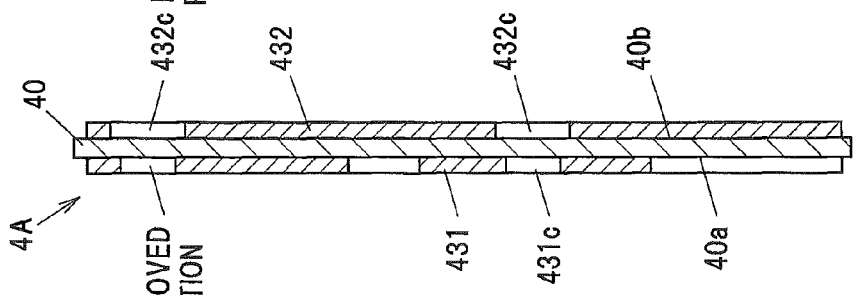
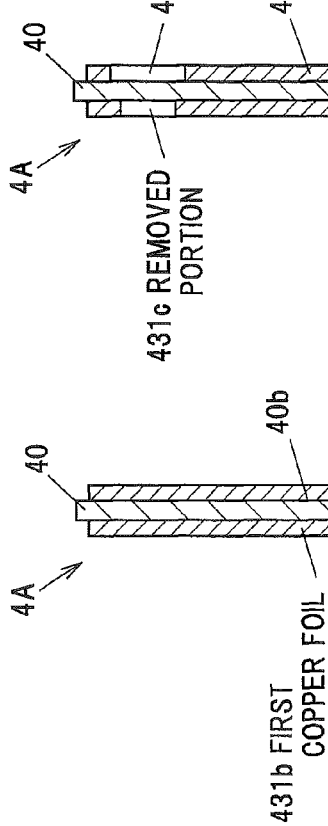

OPTICAL MODULE

The present application is based on Japanese patent application No. 2013-012900 filed on Jan. 28, 2013, the entire contents of which are incorporated herein by reference.

BACKGROUND OF THE INVENTION

1. Field of the Invention

The invention relates to an optical module that transmits and/or receives signals using light rays.

2. Description of the Related Art

A optical module is known that is provided with a photoelectric conversion element mounted on a substrate and an optical coupling member for coupling the photoelectric conversion element to an optical fiber (See e.g. JP-A-2010-122311, paragraph 0042 of the specification and FIGS. 1 and 5).

The optical module disclosed in JP-A-2010-122311 is constructed such that a protrusion wall for positioning is provided on a lens block as the optical coupling member and the lens block is positioned and fixed to the substrate by fitting the protrusion wall into a fitting hole of the substrate. In addition, the lens block has integrally a fiber-side lens array facing an end face of the optical fiber and an optical device-side lens array facing the photoelectric conversion element.

The photoelectric conversion element is mounted on a component-mounting surface of the substrate (a surface opposite to a surface facing the lens block) so as to sandwich the substrate between itself and the lens block. Where the photoelectric conversion element is a light-receiving element, light emitted from the optical fiber is incident on the lens block through the fiber-side lens array, is internally reflected at a reflecting surface of the lens block and is emitted from the optical device-side lens array toward the photoelectric conversion element. On the other hand, where the photoelectric conversion element is a light-emitting element, light emitted from the photoelectric conversion element is incident on the lens block through the optical device-side lens array, is internally reflected at the reflecting surface of the lens block and is emitted from the fiber-side lens array toward the optical fiber.

SUMMARY OF THE INVENTION

The positioning of the optical coupling member to the photoelectric conversion element (or the mounting substrate) needs to be performed with a high accuracy of e.g. several μm. However, it is very difficult to achieve the high accuracy positioning even by fitting the protrusion into the hole as described above. Therefore, it has been ever desired to develop a technique that allows the high accuracy positioning of the optical coupling member to the photoelectric conversion element (or the mounting substrate).

It is an object of the invention to provide an optical module that allows the high accuracy positioning of the optical coupling member to the photoelectric conversion element (or the mounting substrate).

(1) According to one embodiment of the invention, an optical module comprises:

a substrate comprising a conductor pattern formed thereon;

a photoelectric conversion element mounted on the substrate; and an optical coupling member for optically coupling the photoelectric conversion element to an optical fiber, wherein a part of the conductor pattern on the substrate defines an engagement portion that engages with the optical coupling member so as to position the optical coupling member relative to the substrate.

In the above embodiment (1) of the invention, the following modifications and changes can be made.

(i) The engagement portion comprises a periphery defined by an end face of the conductor pattern that is formed on a surface of the substrate on which the photoelectric conversion element is mounted.

(ii) The engagement portion comprises a through-hole that includes the end face of the conductor pattern as an inside surface thereof and penetrates through the substrate.

(iii) The optical coupling member comprises a housing portion for housing an end portion of the optical fiber and a lens portion for focusing light that propagates through the optical fiber.

(iv) An end portion of the substrate is held by a connector fixed to a supporting member, and wherein the optical coupling member comprises a protruding portion fitted into a fitting hole formed on the supporting member.

(v) The substrate comprises an elastically deformable flexible substrate having flexibility and is pressed against the optical coupling member by a restoring force generated by the elastic deformation.

(vi) An end portion of the substrate is held by a connector fixed to a supporting member and is elastically curved between a first region along the supporting member and a second region along the optical coupling member.

EFFECTS OF THE INVENTION

According to one embodiment of the invention, an optical module can be provided that allows the high accuracy positioning of the optical coupling member to the photoelectric conversion element (or the mounting substrate).

BRIEF DESCRIPTION OF THE DRAWINGS

Next, the present invention will be explained in more detail in conjunction with appended drawings, wherein:

FIGS. 2A and 2B show a circuit board, wherein FIG. 2A is a plan view and FIG. 2B is a cross sectional view taken on line A-A of FIG. 2A;

FIGS. 3A to 3C show an optical module in a modification of the first embodiment, wherein FIG. 3A is a cross sectional view showing an example of the structure, FIG. 3B is an enlarged view of the section B and FIG. 3C is an enlarged view of the section C;

FIGS. 4A to 4C are cross sectional views showing a process of forming a circuit board in the modification of the first embodiment.

DETAILED DESCRIPTION OF THE PREFERRED EMBODIMENTS

First Embodiment

Figure 1:
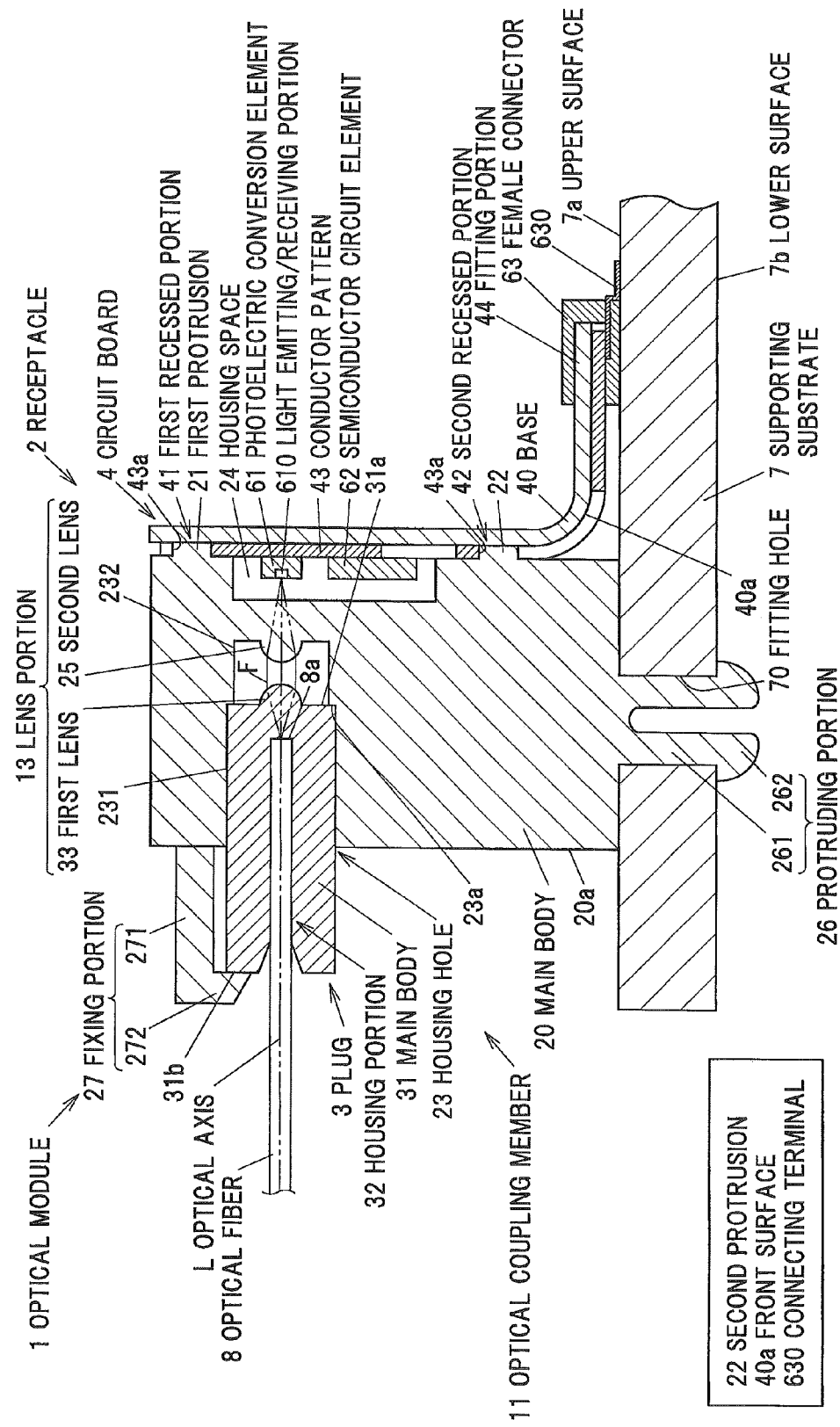
FIG. 1 is a cross sectional view showing an example of an optical module in a first embodiment of the present invention.

FIG. 1 is a cross sectional view showing an example of an optical module in the first embodiment of the invention.

Structure of Optical Module 1

As shown in FIG. 1, an optical module 1 is used in a state of being mounted on a supporting substrate 7 as a supporting member. The supporting substrate 7 is, e.g., a glass epoxy substrate in which a wiring pattern is formed on a plate-like base made of glass fiber impregnated with epoxy resin and then subjected to thermosetting treatment. Non-illustrated electronic components such as CPU (Central Processing Unit) or storage unit are mounted on the supporting substrate 7 and transmit, or receive, or transmit and receive signals to/from another electronic circuit board or electronic device through optical communication in which an optical fiber 8 mounted on the optical module 1 is used as a transmission medium.

The optical module 1 is provided with a circuit board 4 composed of a plate-like base 40 and a conductor pattern 43 formed thereon, a photoelectric conversion element 61 mounted on the circuit board 4, a semiconductor circuit element 62 electrically connected to the photoelectric conversion element 61, and an optical coupling member 11 for optically coupling the photoelectric conversion element 61 to the optical fiber 8.

The circuit board 4 is an elastically deformable flexible substrate in which the conductor pattern 43 made of a conductive metal foil is formed on a front surface 40a of the base 40 made of e.g., a flexible film-like insulation such as polyimide (PI).

The conductor pattern 43 is formed by, e.g., etching a copper foil and has a thickness of around 100 µm. The base 40 has a thickness of, e.g., 50 µm to 100 µm. A first recessed portion 41 and a second recessed portion 42 both serving as engagement portions formed by the conductor pattern 43 are provided on the front surface 40a of the base 40. The photoelectric conversion element 61 and the semiconductor circuit element 62 are mounted on the conductor pattern 43 and are arranged between the first recessed portion 41 and the second recessed portion 42.

A fitting portion 44 formed at an end portion of the circuit board 4 is held by a female connector 63 which is fixed to an upper surface 7a of the supporting substrate 7. The fitting portion 44 is fitted into the female connector 63 from a direction parallel to the supporting substrate 7. Plural connecting terminals 630 housed in the female connector 63 are connected, at one end, to the conductor pattern 43 and, at the other end, to non-illustrated electrodes mounted on the upper surface 7a of the supporting substrate 7, thereby electrically connecting the circuit board 4 to the electrodes of the supporting substrate 7.

In addition, due to the fitting of the fitting portion 44 into the female connector 63, the circuit board 4 has a curvature between the female connector 63 and the optical coupling member 11. A restoring force of the circuit board 4 generated by the elastic deformation causes the base 40 to be pressed against the optical coupling member 11.

A first protrusion 21 protruding toward the circuit board 4 so as to be engaged with the first recessed portion 41 and a second protrusion 22 protruding toward the circuit board 4 so as to be engaged with the second recessed portion 42 are formed on the optical coupling member 11. The optical coupling member 11 is positioned on the circuit board 4 by engagement of the first protrusion 21 with the first recessed portion 41 and engagement of the second protrusion 22 with the second recessed portion 42. The optical coupling member 11 and the circuit board 4 are adhesively fixed by an adhesive, e.g., acrylic resin, etc.

The optical coupling member 11 is arranged so that a surface having the first protrusion 21 and the second protrusion 22 thereon faces the photoelectric conversion element 61 and the semiconductor circuit element 62 which are mounted on the conductor pattern 43. In other words, the first protrusion 21 and the second protrusion 22 of the optical coupling member 11 are engaged with an end face 43a of the conductor pattern 43 formed on a surface of the circuit board 4 having the photoelectric conversion element 61 and the semiconductor circuit element 62 mounted thereon (on the front surface 40a of the base 40).

The photoelectric conversion element 61 is an element which converts an electric signal into an optical signal or an optical signal into an electric signal. Examples of the former which is a light-emitting element include a laser diode and a VCSEL (Vertical Cavity Surface Emitting Laser), etc. Meanwhile, examples of the latter which is a light-receiving element include a photodiode. The photoelectric conversion element 61 is configured to emit light toward the optical fiber 8 or to receive light from the optical fiber 8.

When the photoelectric conversion element 61 is an element which converts an electric signal into an optical signal, the semiconductor circuit element 62 is a driver IC which drives the photoelectric conversion element 61 based on an electric signal input from the electronic circuit board. On the other hand, when the photoelectric conversion element 61 is an element which converts the received optical signal into an electric signal, the semiconductor circuit element 62 is a receiver IC which amplifies an electric signal input from the photoelectric conversion element 61 and outputs the amplified electric signal to the electronic circuit.

The entire length of the optical module 1 along an extending direction of the optical fiber 8 (a direction parallel to the supporting substrate 7) is, e.g., 5.0 mm to 8.0 mm.

Structure of Optical Coupling Member 11

The optical coupling member 11 is composed of a plug 3 with the optical fiber 8 attached thereto and a rectangular parallelepiped receptacle 2 into which the plug 3 is fitted. The plug 3 has a main body 31 with a cylindrical housing portion 32 for housing an end portion of the optical fiber 8, and a first lens 33 for receiving or emitting light propagating through the optical fiber 8. A lens portion 13 for focusing light propagating through the optical fiber 8 is composed of the first lens 33 and a blow-described second lens 25. The optical fiber 8 is housed in the housing portion 32 so that an end face 8a faces the first lens 33.

The receptacle 2 is formed of a transparent resin and has a main body 20 having a housing hole 23 formed therein to house the plug 3, the second lens 25 provided on the bottom end of the housing hole 23, a fixing portion 27 for fixing the plug 3 and a protruding portion 26 fitted into a fitting hole 70 formed on the supporting substrate 7.

The housing hole 23 has integrally a first cylindrical portion 231 for housing the plug 3 and a second cylindrical portion 232 provided with the second lens 25. The second cylindrical portion 232 is formed to have a smaller inner diameter than the first cylindrical portion 231. A stepped surface 23a is thus formed between the first cylindrical portion 231 and the second cylindrical portion 232. An end face 31a of the plug 3 on the first lens 33 side butts against the stepped surface 23a and the plug 3 is fixed by the fixing portion 27. The fixing portion 27 has an extended portion 271 and a locking portion 272. The extended portion 271 extends in a direction parallel to the extending direction of the optical fiber 8 from an end face 20a of the main body 20 on the opposite side to the circuit board 4, and the locking portion 272 is formed at an end portion of the extended portion 271. The locking portion 272 of the fixing portion 27 is locked to an end face 31b of the plug 3 on the opposite side to the end face 31a, thereby fixing the plug 3 to the receptacle 2.

The first protrusion 21, the second protrusion 22 and a housing space 24 for housing the photoelectric conversion element 61 and the semiconductor circuit element 62 are formed on an end portion of the main body 20 on the opposite side to the end face 20a having the fixing portion 27. The housing space 24 is formed between the first protrusion 21 and the second protrusion 22.

The second lens 25 is arranged so as to face the first lens 33. The optical fiber 8, the first lens 33 and the second lens 25 constituting the lens portion 13 and the photoelectric conversion element 61 are disposed such that the respective central axes coincide with each other.

The protruding portion 26 has a pair of leg portions 261 and arc-shaped locking portions 262 formed at respective end portions of the pair of leg portions 261. The leg portions 261 extend in the fitting hole 70 of the supporting substrate 7 from the upper surface 7a toward a lower surface 7b. The locking portions 262 of the protruding portion 26 are locked to the lower surface 7b of the supporting substrate 7, thereby fixing the receptacle 2 to the supporting substrate 7.

Structure of Circuit Board 4

FIGS. 2A and 2B show the circuit board 4, wherein FIG. 2A is a plan view and FIG. 2B is a cross sectional view taken on line A-A of FIG. 2A. Note that, the first protrusion 21 and the second protrusion 22 are indicated by a two-dot chain line.

The circuit board 4 is obtained by forming the conductor pattern 43 made of, e.g., a copper foil on the front surface 40a of the base 40. The conductor pattern 43 is formed only on the front surface 40a of the base 40 in FIGS. 2A and 2B, but may be formed also on a back surface of the base 40.

The photoelectric conversion element 61 and the semiconductor circuit element 62 are electrically connected via a bonding wire 9a. The semiconductor circuit element 62 is electrically connected to the conductor pattern 43 via plural bonding wires 9b. In the first embodiment, the conductor pattern 43 has wiring patterns for power supply, grounding, communication signals and control signals, and each pattern is connected to the semiconductor circuit element 62 via each bonding wire 9b.

Identification marks 45 are provided at four corners of the conductor pattern 43 for the purpose of accurate positioning at the time of mounting the photoelectric conversion element 61 and the semiconductor circuit element 62. The identification mark 45 has a square shape in the first embodiment but may be in various shapes.

Note that, in addition to the photoelectric conversion element 61 and the semiconductor circuit element 62, it is possible to mount electronic components such as connector, IC (Integrated Circuit), active device (transistor, etc.) or passive device (resistor, capacitor, etc.) on the circuit board 4.

As shown in FIGS. 2A and 2B, the first recessed portion 41 is formed on the photoelectric conversion element 61 side and the second recessed portion 42 is formed on the semiconductor circuit element 62. Each of the first recessed portion 41 and the second recessed portion 42 has a periphery formed by the end face 43a of the conductor pattern 43. In the first embodiment, the first recessed portion 41 and the second recessed portion 42 are rectangular in a plan view of the circuit board 4. Alternatively, the shape of the first recessed portion 41 and the second recessed portion 42 may be, e.g., trapezoidal or circular, etc.

In the first embodiment, end faces $43a_1$, $43a_2$ and $43a_3$ of the conductor pattern 43 serve as the periphery of the first recessed portion 41. The end faces $43a_1$ and $43a_2$ are parallel to each other and the end face $43a_3$ is orthogonal thereto. End faces $43a_{11}$, $43a_{12}$ and $43a_{13}$ of the conductor pattern 43 serve as the periphery of the second recessed portion 42. The end faces $43a_{11}$ and $43a_{12}$ are parallel to each other and the end face $43a_{13}$ is orthogonal thereto.

The outer peripheral surface of the first protrusion 21 is in contact with the faces $43a_1$, $43a_2$ and $43a_3$ of the conductor pattern 43 in the first recessed portion 41 and the outer peripheral surface of the second protrusion 22 is in contact with the faces $43a_{11}$, $43a_{12}$ and $43a_{13}$ of the conductor pattern 43 in the second recessed portion 42, which results in that the optical coupling member 11 is accurately positioned so that a light emitting/receiving portion 610 of the photoelectric conversion element 61 coincides with a focal point of the second lens 25.

The circuit board 4 consists of a first region 4a along the supporting substrate 7, a second region 4b along the optical coupling member 11 and a third region 4c formed between the first region 4a and the second region 4b. In the first embodiment, the first region 4a is arranged in parallel to the supporting substrate 7 and the second region 4b is arranged perpendicular to the supporting substrate 7. The third region 4c is curved between the first region 4a and the second region 4b.

The female connector 63 (see FIG. 1) fixed to the supporting substrate 7 holds the circuit board 4 at the fitting portion 44 which is an end portion of the first region 4a, and the third region 4c is elastically curved between the first region 4a and the second region 4b. That is, the elastic curvature of the third region 4c causes the second region 4b to be pressed against the optical coupling member 11.

Operation of Optical Module 1

Next, operation of the optical module 1 will be described in reference to FIG. 1. The explanation here focuses on the case where the photoelectric conversion element 61 is a VCSEL (Vertical Cavity Surface Emitting Laser) and the semiconductor circuit element 62 is a driver IC for driving the photoelectric conversion element 61.

The optical module 1 is operated by receiving operating power supply from the supporting substrate 7. The operating power is supplied to the photoelectric conversion element 61 and the semiconductor circuit element 62 via the female connector 63 and the circuit board 4. Meanwhile, signals to be transmitted using the optical fiber 8 as a transmission medium are input to the semiconductor circuit element 62 from the supporting substrate 7 via the female connector 63 and the conductor pattern 43. The semiconductor circuit element 62 drives the photoelectric conversion element 61 based on the input signal.

The photoelectric conversion element 61 emits laser light toward the second lens 25 of the receptacle 2. The laser light incident on the second lens 25 becomes a luminous flux F parallel to the supporting substrate 7 and is then incident on the first lens 33 of the plug 3. The laser light incident on the first lens 33 is incident on a core of the optical fiber 8 from the end face 8a thereof. In FIG. 1, an optical axis L and the luminous flux F of the laser light are indicated by a two-dot chain line.

When the photoelectric conversion element 61 is, e.g., a photodiode and the semiconductor circuit element 62 is a receiver IC, the light-traveling direction is reversed and the photoelectric conversion element 61 converts the received optical signal into an electric signal and outputs the electric signal to the semiconductor circuit element 62. The semiconductor circuit element 62 then amplifies the electric signal and outputs the amplified electric signal to the supporting substrate 7 via the circuit board 4 and the female connector 63.

Functions and Effects of the First Embodiment

The following functions and effects are obtained in the first embodiment.

(1) Since the optical coupling member 11 is positioned on the circuit board 4 by engagement of the first protrusion 21 with the first recessed portion 41 of the circuit board 4 and engagement of the second protrusion 22 with the second recessed portion 42 of the circuit board 4, it is possible to accurately position the optical coupling member 11 to the photoelectric conversion element 61. That is, since the photoelectric conversion element 61 is accurately positioned on the conductor pattern 43 of the circuit board 4 using the identification mark 45 as a reference point and the end face 43*a* of the conductor pattern 43 serves as the respective peripheries of the first recessed portion 41 and the second recessed portion 42, it is possible to accurately position the optical coupling member 11 to the photoelectric conversion element 61 by engagement of the first protrusion 21 with the first recessed portion 41 and engagement of the second protrusion 22 with the second recessed portion 42.

(2) The optical coupling member 11 is engaged with the end face 43*a* of the conductor pattern 43 which is formed on the surface having the photoelectric conversion element 61 and the semiconductor circuit element 62 mounted thereon (on the front surface 40*a* of the base 40). That is, since the circuit board 4 has the first recessed portion 41, the second recessed portion 42 and the identification marks 45 on the same surface, it is possible to position the optical coupling member 11 to the photoelectric conversion element 61 more accurately.

(3) Since the optical coupling member 11 has integrally the housing portion 32 for housing the end portion of the optical fiber 8 and the lens portion 13 for focusing light propagating through the optical fiber 8, it is possible to position the end face 8*a* of the optical fiber 8 to the lens portion 13 with high accuracy.

(4) The circuit board 4 is an elastically deformable flexible substrate having flexibility and the base 40 is pressed against the optical coupling member 11 by a restoring force generated by elastic deformation. Therefore, even if the receptacle 2 is misaligned from the supporting substrate 7 due to stress applied at the time of attaching/detaching the plug 3 to/from the receptacle 2, it is possible to absorb the misalignment and thus to maintain the engagement of the first protrusion 21 with the first recessed portion 41 and the engagement of the second protrusion 22 with the second recessed portion 42.

(5) Since the circuit board 4 is held at the fitting portion 44 by the female connector 63 fixed to the supporting substrate 7 and is curved in the third region 4*c* by arranging the second region 4*b* so as to face the receptacle 2, it is not necessary to provide a special member for bending the circuit board 4, such as a guide member. As a result, it is possible to reduce the number of components and to make a small optical module 1 at low cost.

Modification

The optical module 1 in the first embodiment can be implemented with, e.g., the following modification. It should be noted that, in the following description, members having the same functions as those described in the first embodiment are denoted by the same reference numerals and the overlapping explanation thereof will be omitted.

FIGS. 3A to 3C show an optical module 1A in the modification of the first embodiment, wherein FIG. 3A is a cross sectional view showing an example of the structure, FIG. 3B is an enlarged view of the section B and FIG. 3C is an enlarged view of the section C.

In the optical module 1A of the present modification, the shape of a first protrusion 21A and a second protrusion 22A of an optical coupling member 11A is different from the shape of the first protrusion 21 and the second protrusion 22 of the optical coupling member 11 in the first embodiment. In addition, a circuit board 4A in the present modification has a different shape from the circuit board 4 of the first embodiment.

As shown in FIGS. 3A to 3C, a conductor pattern 43A of the circuit board 4A is composed of a first conductor pattern 431 formed on the front surface 40*a* of the base 40 and a second conductor pattern 432 formed on a back surface 40*b* of the base 40. On the circuit board 4A, a first through-hole 401 and a second through-hole 402 formed by the first conductor pattern 431 are formed as engagement portions to be engaged with the optical coupling member 11A. The first through-hole 401 and the second through-hole 402 include an end face 431*a* of the first conductor pattern 431 as inner surfaces thereof.

As shown in FIG. 3B, the first protrusion 21A of a receptacle 2A has integrally a base portion 211 penetrating through the first through-hole 401 and a flange portion 212 in contact with the back surface 40*b* of the base 40. A front end portion of the base portion 211 protruding from the first through-hole 401 is melted by heating, thereby forming the flange portion 212.

Likewise, as shown in FIG. 3C, the second protrusion 22A has integrally a base portion 221 penetrating through the second through-hole 402 and a flange portion 222 in contact with the back surface 40*b* of the base 40. A front end portion of the base portion 221 protruding from the second through-hole 402 is melted by heating, thereby forming the flange portion 222.

In the present modification, the optical coupling member 11A is positioned on the circuit board 4A by engagement of the first protrusion 21A with the first through-hole 401 of the circuit board 4A and engagement of the second protrusion 22A with the second through-hole 402 of the circuit board 4A.

Next, a process of forming the circuit board 4A will be described in reference to FIGS. 4A to 4C.

FIGS. 4A to 4C are cross sectional views showing a process of forming the circuit board 4A in the modification of the first embodiment.

The process of forming the circuit board 4A includes a first step of forming a first copper foil 431*b* on the front surface 40*a* of the base 40 and a second copper foil 432*b* on the back surface 40*b*, a second step of forming the first conductor pattern 431 by partially removing the first copper foil 431*b* and the second conductor pattern 432 by partially removing the second copper foil 432*b*, and a third step in which the base 40 is carved by irradiating a laser beam on a removed portion 431*c* formed by removing the first copper foil 431*b*. The first to third steps will be described in more detail below.

In the first step, using, e.g., adhesive bonding, vapor deposition or non-electrolytic plating, etc., the first copper foil 431*b* is formed on the front surface 40*a* of the base 40 and the second copper foil 432*b* is formed on the back surface 40*b*, as shown in FIG. 4A. In the present modification, the first copper foil 431b and the second copper foil 432b each have a thickness of, e.g., 75 μm and the base 40 has a thickness of, e.g., 50 μm to 100 μm.

In the second step, the first copper foil 431b is partially removed by etching, thereby forming the first conductor pattern 431 with plural removed portions 431c (two in the present modification), as shown in FIG. 4B. Likewise, the second copper foil 432b is partially removed by etching, thereby forming the second conductor pattern 432 with plural removed portions 432c (two in the present modification).

The removed portion 431c formed by removing the first copper foil 431b and the removed portion 432c formed by removing the second copper foil 432b face each other with the base 40 interposed therebetween. The area of the removed portion 432c formed by removing the second copper foil 432b is larger than the area of the removed portion 431c formed by removing the first copper foil 431b, and the entire removed portion 431c formed by removing the first copper foil 431b is within the removed portion 432c formed by removing the second copper foil 432b when viewing the circuit board 4A from the back surface 40b side.

In the third step, a laser beam is irradiated on the front surface 40a of the base 40 in the area of two removed portions 431c which are formed by removing the first copper foil 431b, and the base 40 is thereby carved from the front surface 40a to the back surface 40b. As the laser beam, it is possible to use, e.g., excimer laser and UV laser (ultraviolet laser), etc. The first through-hole 401 and the second through-hole 402 are thereby formed.

The present modification achieves the following functions and effects in addition to the functions and effects (1) to (5) of the first embodiment.

The through-hole 401 and the second through-hole 402 are formed by irradiating a laser beam on the base 40 using the first copper foil 431b as a resist film, and thus can be formed as highly accurate through-holes.

In addition, since the through-hole 401 and the second through-hole 402 include the end face 431a of the first conductor pattern 431 as the inner surfaces thereof in addition to penetration through the base 40, the first protrusion 21A and the second protrusion 22A are deeply engaged. As a result, it is possible to reliably position the photoelectric conversion element 61 to the optical coupling member 11A. Furthermore, even if the first copper foil 431b and the second copper foil 432b are formed thinner as compared to the first embodiment, the first protrusion 21A and the second protrusion 22A can be reliably engaged.

In addition, since the optical module 1A has the second conductor pattern 432 on the back surface 40b, it is easy to handle high-frequency signals when using the second conductor pattern 432 as, e.g., a ground pattern. Furthermore, since the conductor pattern 43A has a two-layer wiring structure composed of the first conductor pattern 431 and the second conductor pattern 432, heat dissipation efficiency is improved as compared to single-layer wiring.

Second Embodiment

Next, the second embodiment of the invention will be described in reference to FIG. 5.

Figure 5:
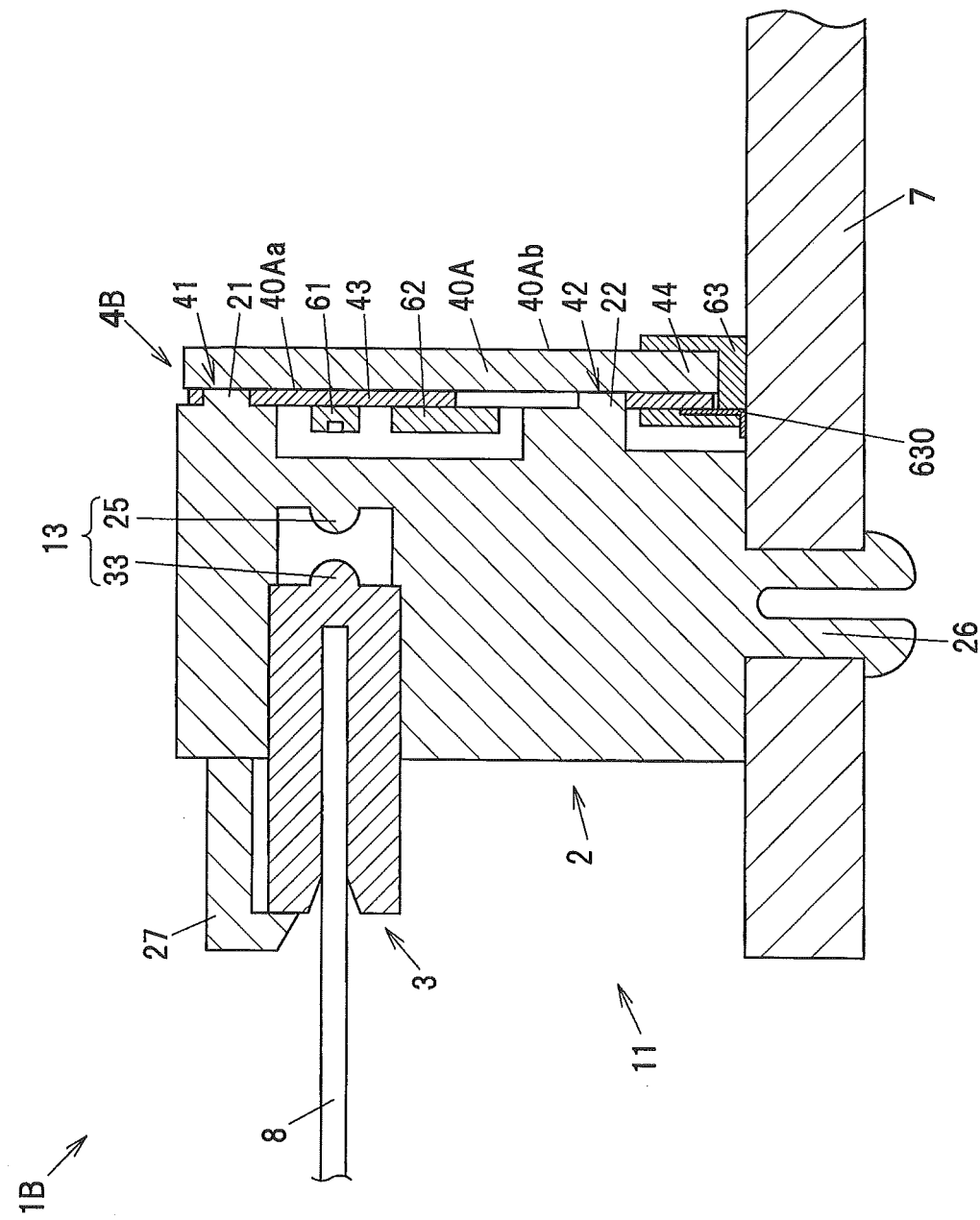
FIG. 5 is a cross sectional view showing an example of an optical module in a second embodiment of the invention.

FIG. 5 is a cross sectional view showing an example of an optical module 1B in a second embodiment of the invention.

In the optical module 1B of the second embodiment, the shape of a circuit board 4B is different from that of the circuit board 4 in the first embodiment and the remaining configuration is the same as the optical module 1 in the first embodiment.

The circuit board 4B is, e.g., a plate-like glass epoxy substrate in which the conductor pattern 43 is formed on a front surface 40Aa of a plate-like base 40A made of glass fiber impregnated with epoxy resin and then subjected to thermosetting treatment. Although the conductor pattern 43 is formed only on the front surface 40Aa of the base 40A in FIG. 5, the conductor pattern 43 may be formed also on a back surface 40Ab.

In the second embodiment, the fitting portion 44 of the circuit board 4B is fitted into the female connector 63 from a direction perpendicular to the supporting substrate 7. The plural connecting terminals 630 housed in the female connector 63 are connected, at one end, to the conductor pattern 43 and, at the other end, to non-illustrated electrodes mounted on the upper surface 7a of the supporting substrate 7, thereby electrically connecting the circuit board 4B to the electrodes of the supporting substrate 7.

The first recessed portion 41 and the second recessed portion 42 are provided on the circuit board 4B on a surface facing the receptacle 2 (the front surface 40Aa). In more detail, the first recessed portion 41 is arranged on the photoelectric conversion element 61 side and the second recessed portion 42 is arranged on the semiconductor circuit element 62. In other words, the photoelectric conversion element 61 is mounted between the first recessed portion 41 and the second recessed portion 42.

The first protrusion 21 is engaged with the first recessed portion 41 of which periphery is a portion of the end face 43a of the conductor pattern 43, the second protrusion 22 is engaged with the second recessed portion 42 of which periphery is another portion of the end face 43a, and the optical coupling member 11 is thereby positioned on the circuit board 4B. Alternatively, the first protrusion 21 and the second protrusion 22 may be engaged with through-holes formed on the base 40A by irradiating a laser beam.

Functions and Effects of the Second Embodiment

The second embodiment achieves the following functions and effects in addition to the functions and effects (1) to (3) of the first embodiment.

Since the base 40A of the circuit board 4B in the second embodiment is formed of a hard material, the rigidity thereof allows the first protrusion 21 of the optical coupling member 11 to be engaged with the first recessed portion 41 of the circuit board 4B while maintaining the engaged state of the second protrusion 22 with the second recessed portion 42 of the circuit board 4B and it is therefore possible to position the optical coupling member 11 and the photoelectric conversion element 61 with high accuracy.

Summary of the Embodiments

Technical ideas understood from the embodiments will be described below citing the reference numerals, etc., used for the embodiments. However, each reference numeral, etc., described below is not intended to limit the constituent elements in the claims to the members, etc., specifically described in the embodiments.

[1] An optical module (1, 1A, 1B), comprising: a substrate (circuit board 4, 4A, 4B) having a conductor pattern (43, 43A) formed thereon; a photoelectric conversion element (61) mounted on the substrate (circuit board 4, 4A, 4B); and an optical coupling member (11, 11A) for optically coupling the photoelectric conversion element (61) to an optical fiber (8); wherein the conductor pattern (43, 43A) of the substrate (circuit board 4, 4A, 4B) forms engagement portions (first recessed portion 41, second recessed portion 42/first through-hole 401, second through-hole 402), and the optical coupling member (11, 11A) is positioned on the substrate (circuit board 4, 4A, 4B) by engagement of the engagement portions (first recessed portion 41, second recessed portion 42/first through-hole 401, second through-hole 402) with the optical coupling member (11, 11A).

[2] The optical module (1, 1A, 1B) described in the [1], wherein peripheries of the engagement portions (first recessed portion 41, second recessed portion 42) are formed by an end face (43a, 431a) of the conductor pattern (43, 431) formed on a surface (front surface 40a, 40Aa) of the substrate (circuit board 4, 4A, 4B) on a photoelectric conversion element (61)-mounting side.

[3] The optical module (1A) described in the [1], wherein the engagement portions (first through-hole 401, second through-hole 402) comprise the end face (431a) of the conductor pattern (431) as inner surfaces thereof, and are through-holes (first through-hole 401, second through-hole 402) penetrating the substrate (circuit board 4A).

[4] The optical module (1, 1A, 1B) described in one of the [1] to [3], wherein the optical coupling member (11, 11A) comprises a housing portion (32) for housing an end portion of the optical fiber (8) and a lens portion (13) for focusing light that propagates through the optical fiber (8).

[5] The optical module (1, 1A, 1B) described in one of the [1] to [4], wherein an end portion (fitting portion 44) of the substrate (circuit board 4, 4A, 4B) is held by a connector (female connector 63) fixed to a supporting member (supporting substrate 7), and the optical coupling member (11, 11A) comprises a protruding portion (26) fitted into a fitting hole (70) formed on the supporting member (supporting substrate 7).

[6] The optical module (1, 1A) described in one of the [1] to [5], wherein the substrate (circuit board 4, 4A) is an elastically deformable flexible substrate having flexibility and is pressed against the optical coupling member (11, 11A) by a restoring force generated by elastic deformation.

[7] The optical module (1, 1A) described in the [6], wherein the substrate (circuit board 4, 4A) is held at an end portion (fitting portion 44) by a connector (female connector 63) fixed to a supporting member (supporting substrate 7) and is elastically curved between a first region (4a) along the supporting member (supporting substrate 7) and a second region (4b) along the optical coupling member (11, 11A).

Although the embodiments of the invention have been described, the invention according to claims is not to be limited to the above-mentioned embodiments. Further, please note that all combinations of the features described in the embodiments are not necessary to solve the problem of the invention.

The invention can be appropriately modified without departing from the gist thereof. For example, although the case where the lens portion 13 of the optical coupling member 11 is composed of two lenses, the first lens 33 provided on the plug 3 and the second lens 25 provided on the receptacle 2, has been described in the embodiments, it is not limited thereto. Lenses may be provided only on the receptacle 2.

In addition, the case where the first protrusion 21 and the second protrusion 22 are formed on the optical coupling member 11 while the first recessed portion 41 and the second recessed portion 42 are formed on the circuit board 4 has been described in the embodiments, it is not limited thereto. For example, it may be such that four recessed portions are formed surrounding the photoelectric conversion element 61 and the semiconductor circuit element 62 and four protrusions are formed on the optical coupling member 11 so as to be engaged with the four recessed portions. In other words, the number of protrusions on the optical coupling member 11 and the number of recessed portions on the circuit board 4 are not limited.

In addition, although the case where the first protrusion 21 and the second protrusion 22 are formed on the optical coupling member 11 while the first recessed portion 41 and the second recessed portion 42 are formed on the circuit board 4 has been described in the embodiments, it is not limited thereto. It may be such that recessed portions are formed on the optical coupling member 11 and protrusions are provided on the circuit board 4.

In addition, although the case where one optical module 1 is mounted on the supporting substrate 7 has been described in the embodiments, it is not limited thereto. Plural optical module structures may be formed on the supporting substrate 7.

In addition, although the case where the base 40 is carved by a laser beam has been described in the embodiments, it is not limited thereto. The base 40 may be carved by machining such as dicing. In case of machining, it is possible to form the first through-hole 401 and the second through-hole 402 at lower cost than the laser beam processing.

In addition, although the case where one optical fiber 8 is mounted on the optical module 1 has been described in the embodiments, it is not limited thereto. The optical module 1 may be configured so that plural optical fibers 8 are mounted thereon.

In addition, although the case where one each of the photoelectric conversion element 61 and the semiconductor circuit element 62 are mounted on the circuit board 4 has been described in the embodiments, it is not limited thereto. Plural photoelectric conversion elements 61 and plural semiconductor circuit elements 62 may be mounted.

In addition, materials of each member constituting the optical module 1 are not limited to those described in the embodiments.

What is claimed is:
1. An optical module, comprising:
a substrate comprising a conductor pattern formed thereon;
a photoelectric conversion element mounted on the substrate; and
an optical coupling member for optically coupling the photoelectric conversion element to an optical fiber,
wherein the substrate includes a stepped engagement portion defined by the conductor pattern, the stepped engagement portion and the optical coupling member being engaged together in such a manner that the optical coupling member is positioned relative to the substrate by using the stepped portion of the conductor pattern,
wherein the stepped engagement portion comprises a periphery defined by an end face of the conductor pattern that is formed on a surface of the substrate on which the photoelectric conversion element is mounted, and
wherein the end face of the conductor pattern comprises a plane vertical to the surface of the substrate.

2. The optical module according to claim 1, wherein the optical coupling member includes a protrusion and a periphery of the protrusion is engaged with the periphery of the stepped engagement portion.

3. The optical module according to claim 1, wherein the stepped engagement portion comprises a through-hole that includes the end face of the conductor pattern as an inside surface thereof and penetrates through the substrate.

4. The optical module according to claim 1, wherein the optical coupling member comprises a housing portion for housing an end portion of the optical fiber and a lens portion for focusing light that propagates through the optical fiber.

5. The optical module according to claim 1, wherein an end portion of the substrate is held by a connector fixed to a supporting member, and
wherein the optical coupling member comprises a protruding portion fitted into a fitting hole formed on the supporting member.

6. The optical module according to claim 1, wherein the substrate comprises an elastically deformable flexible substrate having flexibility and is pressed against the optical coupling member by a restoring force generated by the elastic deformation.

7. The optical module according to claim 6, wherein an end portion of the substrate is held by a connector fixed to a supporting member and is elastically curved between a first region along the supporting member and a second region along the optical coupling member.

8. The optical module according to claim 1, wherein the optical coupling member includes a fixing portion, which fixes the optical fiber.

9. The optical module according to claim 1, wherein the substrate is devoid of a through-hole in the stepped engagement portion.

10. The optical module according to claim 1, wherein the optical coupling member is positioned relative to the substrate only by the stepped engagement portion of the conductor pattern.

11. The optical module according to claim 1, wherein the stepped engagement portion positions the optical coupling member relative to the substrate in a direction parallel to a direction of a lateral extension of the optical fiber.

12. The optical module according to claim 1, wherein the stepped engagement portion comprises a first recessed portion and a second recessed portion that are defined by the conductor pattern and are provided on the surface of the substrate.

13. The optical module according to claim 12, wherein the photoelectric conversion element is mounted on the conductor pattern and is arranged between the first recessed portion and the second recessed portion.

14. The optical module according to claim 13, wherein the optical coupling member comprises a first protrusion protruding toward the substrate to be engaged with the first recessed portion and a second protrusion protruding toward the substrate to be engaged with the second recessed portion.

15. The optical module according to claim 14, wherein the optical coupling member is positioned relative to the substrate by an engagement of the first protrusion with the first recessed portion and an engagement of the second protrusion with the second recessed portion.

16. The optical module according to claim 15, wherein the first protrusion and the second protrusion of the optical coupling member are engaged with a side surface of the conductor pattern, a bottom surface of the conductor pattern being disposed on the surface of the substrate that the photoelectric conversion element is mounted thereon.

17. The optical module according to claim 16, wherein the first protrusion and the second protrusion of the optical coupling member are further engaged with another side surface of the conductor pattern, said side surface and said another side surface of the conductor pattern extending orthogonal to a direction of an extension of the bottom surface of the conductor pattern.

18. The optical module according to claim 17, wherein the first protrusion and the second protrusion of the optical coupling member abut said side surface of the conductor pattern, said another side surface of the conductor pattern, and the surface of the substrate.

19. The optical module according to claim 13, further comprising a semiconductor circuit element mounted on the conductor pattern between the first recessed portion and the second recessed portion.

20. The optical module according to claim 19, further comprising identification marks provided at corners of the conductor pattern for positioning the photoelectric conversion element and the semiconductor circuit element,
wherein the first recessed portion, the second recessed portion, and the identification marks are provided on the surface of the substrate.

* * * * *